(12) United States Patent
Hein et al.

(10) Patent No.: US 7,411,862 B2
(45) Date of Patent: Aug. 12, 2008

(54) CONTROL SIGNAL TRAINING

(75) Inventors: Thomas Hein, Munich (DE); Aaron John Nygren, San Francisco, CA (US); Rex Kho, Holzkirchen (DE)

(73) Assignee: Qimonda AG, Munich (DE)

( * ) Notice: Subject to any disclaimer, the term of this patent is extended or adjusted under 35 U.S.C. 154(b) by 80 days.

(21) Appl. No.: 11/560,293

(22) Filed: Nov. 15, 2006

(65) Prior Publication Data
US 2008/0112235 A1    May 15, 2008

(51) Int. Cl.
    *G11C 8/00* (2006.01)
(52) U.S. Cl. .............................. 365/233.1; 365/189.18; 365/230.02; 365/233.19
(58) Field of Classification Search ................ 365/191, 365/189.18, 189.12, 189.03, 189.08, 233, 365/230.02, 230.05, 233.13, 233.19, 233.1
See application file for complete search history.

(56) References Cited

U.S. PATENT DOCUMENTS

| | | | |
|---|---|---|---|
| 6,043,768 A * | 3/2000 | Strasser et al. ............... 341/144 |
| 6,532,188 B2 * | 3/2003 | Dietrich et al. ........... 365/233.1 |
| 6,717,832 B2 * | 4/2004 | Johnson et al. ............... 365/52 |
| 7,079,428 B2 * | 7/2006 | Nygren ........................ 365/194 |
| 7,102,940 B2 * | 9/2006 | Kho ............................ 365/194 |
| 2007/0061671 A1 * | 3/2007 | Wallner et al. ............... 714/758 |

* cited by examiner

*Primary Examiner*—Son Dinh
*Assistant Examiner*—Hien N Nguyen
(74) *Attorney, Agent, or Firm*—Patterson & Sheridan, L.L.P.

(57) ABSTRACT

A control signal training system in an integrated circuit comprises a signal transmitting unit, the signal transmitting unit outputting control signals and sampling clock signals, the control signals and the sampling clock signals having a predetermined time phase with respect to each other, a signal receiving unit, the signal receiving unit latching control signals in relation to the sampling clock signals, and an evaluation unit connected to a reading unit and the signal transmitting unit, the evaluation unit determining concordance of the control signals outputted by the signal transmitting unit and the control signals read out by the reading unit from the signal receiving unit, the evaluation unit adapting the time phase between the control signals and the sampling clock signals step-by-step until concordance of the control signals outputted by the signal transmitting unit and the control signals read out the reading unit from the signal receiving unit is determined by the evaluation unit.

27 Claims, 6 Drawing Sheets

FIG 5

| | 1 | 2 | 3 | 4 | 5 | 6 | 7 | 8 | 9 | 10 | 11 | 12 | 13 | 14 |
|---|---|---|---|---|---|---|---|---|---|---|---|---|---|---|
| A | $V_{SSQ}$ | DQ1 | $V_{SSQ}$ | DQ0 | $V_{SS}$ | | | | | $V_{SS}$ | DQ8 | $V_{SSQ}$ | DQ9 | $V_{SSQ}$ |
| B | $V_{DDQ}$ | DQ3 | $V_{DDQ}$ | DQ2 | $V_{DD}$ | | | | | $V_{DD}$ | DQ10 | $V_{DDQ}$ | DQ11 | $V_{DDQ}$ |
| C | $V_{SSQ}$ | DBI0 | $V_{SSQ}$ | EDC0A | $V_{SSQ}$ | | BYTE0 | | BYTE1 | $V_{SSQ}$ | EDC1 | $V_{SSQ}$ | DBI1 | $V_{SSQ}$ |
| D | $V_{DDQ}$ | VPP (RFU) | $V_{DDQ}$ | FCK0 | FCK0# | | | | | FCK1# | FCK1 | $V_{DDQ}$ | VREFD (RFU) | $V_{DDQ}$ |
| E | $V_{SSQ}$ | DQ5 | $V_{SSQ}$ | DQ4 | $V_{DDQ}$ | | | | | $V_{DDQ}$ | DQ12 | $V_{SSQ}$ | DQ13 | $V_{SSQ}$ |
| F | $V_{DDQ}$ | DQ7 | $V_{DDQ}$ | DQ6 | $V_{SSQ}$ | | | | | $V_{SSQ}$ | DQ14 | $V_{DDQ}$ | DQ15 | $V_{DDQ}$ |
| G | $V_{DD}$ | $V_{DDQ}$ | RAS# | $V_{SS}$ | $V_{SS}$ | | | | | $V_{SS}$ | $V_{DD}$ | CAS# | $V_{DDQ}$ | $V_{DD}$ |
| H | $V_{SS}$ | $V_{SSQ}$ | RFU | A0 A10 | A1 A9 | | | | | BA3 A3 | A11 A2 | RFU | $V_{SSQ}$ | $V_{SS}$ |
| J | MF | RESET | CKE# | AB? | RFU A12 | | | | | SEN | CK# | CK | ZQ | VREFC |
| K | $V_{SS}$ | $V_{SSQ}$ | RFU | A7 A8 | BA0 A6 | | | | | BA1 A5 | BA2 A4 | RFU | $V_{SSQ}$ | $V_{SS}$ |
| L | $V_{DD}$ | $V_{DDQ}$ | CS# | $V_{DD}$ | $V_{SS}$ | | | | | $V_{SS}$ | $V_{DD}$ | WE# | $V_{DDQ}$ | $V_{DD}$ |
| M | $V_{DDQ}$ | DQ24 | $V_{DDQ}$ | DQ26 | $V_{SSQ}$ | | | | | $V_{SSQ}$ | DQ12 | $V_{DDQ}$ | DQ16 | $V_{DDQ}$ |
| N | $V_{SSQ}$ | DQ26 | $V_{SSQ}$ | DQ27 | $V_{DDQ}$ | | | | | $V_{DDQ}$ | DQ19 | $V_{SSQ}$ | DQ18 | $V_{SSQ}$ |
| P | $V_{DDQ}$ | VPP (RFU) | $V_{DDQ}$ | FCK3 | FCK3# | | | | | FCK2# | FCK2 | $V_{DDQ}$ | VREFD (RFU) | $V_{DDQ}$ |
| R | $V_{SSQ}$ | DBI3 | $V_{SSQ}$ | EDC3 | $V_{SSQ}$ | | BYTE3 | | BYTE2 | $V_{SSQ}$ | EDC2 | $V_{SSQ}$ | DBI2 | $V_{SSQ}$ |
| T | $V_{DDQ}$ | DQ28 | $V_{DDQ}$ | DQ29 | $V_{DD}$ | | | | | $V_{DD}$ | DQ21 | $V_{DDQ}$ | DQ20 | $V_{DDQ}$ |
| V | $V_{SSQ}$ | DQ30 | $V_{SSQ}$ | DQ31 | $V_{SS}$ | | | | | $V_{SS}$ | DQ23 | $V_{SSQ}$ | DQ22 | $V_{SSQ}$ |

CONTROL SIGNAL TRAINING

BACKGROUND OF THE INVENTION

1. Field of the Invention

The present invention relates to a control signal training system in an integrated circuit, to a memory module and a computer system. The invention further relates to a control signal training method.

2. Description of the Related Art

Demands imposed on large scale integrated circuits are constantly increasing. In the case of memory devices, said demands mainly translate into speed and storage capacity. As far as high-speed memory devices are concerned, the computer industry has established the so-called DRAM (Dynamic Random Access Memory) as an economic means for high speed and high capacity data storage.

Although a DRAM requires continuous refreshing of stored information, speed and information density, combined with relatively low cost, have put DRAM in a pivotal position in the field of information technology. Almost every modern computer system, ranging, for example, from PDAs over notebook computers and desktop personal computers to high-end servers, takes advantage of this economic and fast data-storage technology.

While the storage capacity of modern memory devices are steadily increasing, the memory device must provide means for a fast and efficient access to the information held in the device. For synchronisation to other components of a computing system or a memory module, data is read from or written into a conventional memory device with respect to a so-called clock signal. This clock signal may periodically alternate between a low-level and a high-level, in this way defining a time unit of the system.

In order to increase data throughput, conventional memory devices employ the so-called double data rate (DDR) concept for data exchange. In this concept, two words of data are exchanged per cycle: a first word is transmitted upon the transition of the clock signal from the low-level to the high-level, and a second word is transmitted upon the subsequent transition of the clock signal from the high-level to the low-level. With this concept, data throughput is increased by a factor of two in respect to the so-called single data rate (SDR) memory devices. The latter SDR-devices only exchange one word of data per clock cycle, for example, upon one transition, either the high-level to low-level transition or the low-level to high-level transition.

Since data exchange rate in modern electronic memory modules is very high, not only the transmission bus-width has increased over recent years, but also the clock frequency of the clock signal has already reached the gigahertz domain. Since in DDR memory devices, the data changes twice within a period of the clock signal, precise timing may be important to avoid data-scrambling and/or data loss. Modern memory modules, therefore, may employ carefully designed signal traces amongst components to ensure correct timing and synchronization, i.e. correct times of arrival of the signals in relation to each other at respective positions, such as landing pads (e.g., pins) for interconnection of the components of the memory module.

Since these timing requirements may result in a complex routing of the manifold of signal traces, the routing itself may represent a sophisticated task and may also limit the density of components that may be placed on a printed circuit board. Conventional high performance memory modules may therefore employ memory controllers which, for example, upon initialization determine an optimized timing between a data signal line and a clock signal to allow for a correct time of arrival of the data signal at the memory device in relation to the clock signal. During a training stage, such a memory controller may write certain data to and read certain data from a memory device, for example a DRAM, and shift the data signal in respect to the clock signal within the time domain, such that the data signal arrives at the memory device with a well-defined synchronisation to the clock signal. The memory controller may vary this time shift until a written value corresponds to a read value, which indicates that timing is correct. In this way, a reliable, fast, and efficient exchange of information is enabled. Since this training sequence may require bi-directional data exchange, certain components or registers are not available for such training methods, since the provision of bi-directionality may require a disadvantageous addition of circuitry. Additional circuitry may not only increase device complexity and cost, but may also worsen signal transmission characteristics, and, therefore, the reliability.

SUMMARY OF THE INVENTION

Various embodiments of the present invention may provide particular advantages for an improved control signal training system in an integrated circuit, an improved memory module and an improved control signal training method.

According to a first embodiment of the invention a control signal training system in an integrated circuit comprises a signal transmitting unit, the signal transmitting unit outputting control signals and sampling clock signals, the control signals and the sampling clock signals having a predetermined time phase with respect to each other. The control signal training system further comprises a signal receiving unit, the signal receiving unit latching control signals in relation to the sampling clock signals. The control signal training system further comprises a control signal transmission bus connected to the signal transmitting unit and the signal receiving unit, the control signal transmission bus transmitting control signals from the signal transmitting unit to the signal receiving unit. The control signal training system further comprises a sampling clock signal transmission line connected to the signal transmitting unit and the signal receiving unit, the sampling clock signal transmission line transmitting sampling clock signals from the signal transmitting unit to the signal receiving unit. The control signal training system further comprises a reading unit connected to the signal receiving unit, the reading unit reading the control signals latched in the control signal receiving unit. The control signal training system further comprises an evaluation unit connected to the reading unit and the signal transmitting unit, the evaluation unit determining concordance of the control signals outputted by the signal transmitting unit and the control signals read out by the reading unit from the signal receiving unit, the evaluation unit adapting the time phase between the control signals and the sampling clock signals step-by-step until concordance of the control signals outputted by the signal transmitting unit and the control signals read out the reading unit from the signal receiving unit is determined by the evaluation unit.

According to a second embodiment of the invention a memory module comprises a memory array including a plurality of memory cells, a memory controller, the memory controller transmitting control signals, data signals and sampling clock signals, a bidirectional data signal transmission bus connected to the memory array and the memory controller, the bidirectional data signal transmission bus transmitting data signals between the memory array and the memory controller, a control signal transmission bus connected to the memory controller and the control signal latch, the control signal transmission bus transmitting control signals from the memory controller to the control signal latch, a sampling clock signal transmission line connected to the memory controller and the control signal latch, the sampling clock signal transmission line transmitting sampling clock signals from the memory controller to the control signal latch, a control unit, the control unit setting a training mode, and a multiplexer connected to the control signal latch and the control unit and to the bidirectional data signal transmission bus, the multiplexer reading out the control signals latched in the control signal latch to the memory controller in the training mode. In the training mode the memory controller determines concordance of the control signals outputted by the memory controller and the control signals read out by the multiplexer from the control signal latch, the memory controller adapting the time phase between the control signals and the sampling clock signals step-by-step until concordance of the control signals outputted by the memory controller and the control signals read out the multiplexer from the control signal latch is determined by the memory controller.

According to a third embodiment of the invention a computer system comprises a signal transmitting unit, the signal transmitting unit outputting control signals and sampling clock signals, the control signals and the sampling clock signals, a signal receiving unit, the signal receiving unit latching control signals in relation to the sampling clock signals, a control signal transmission bus connected to the signal transmitting unit and the signal receiving unit, the control signal transmission bus transmitting control signals from the signal transmitting unit to the signal receiving unit, a sampling clock signal transmission line connected to the signal transmitting unit and the signal receiving unit, the sampling clock signal transmission line transmitting sampling clock signals from the signal transmitting unit to the signal receiving unit, a reading unit connected to the signal receiving unit, the reading unit reading the control signals latched in the control signal receiving unit and an evaluation unit connected to the reading unit and the signal transmitting unit. The evaluation unit determines concordance of the control signals outputted by the signal transmitting unit and the control signals read out by the reading unit from the signal receiving unit and calibrates the time phase between the control signals and the sampling clock signals until concordance of the control signals outputted by the signal transmitting unit and the control signals read out the reading unit from the signal receiving unit is determined by the evaluation unit.

According to a fourth embodiment of the invention a computer system comprises a plurality of storage units, the storage units transmitting data signals via a bidirectional data signal transmission bus to the plurality of storage units, a signal transmitting unit, the signal transmitting unit outputting control signals and sampling clock signals, the control signals and the sampling clock signals, a signal receiving unit, the signal receiving unit latching control signals in relation to the sampling clock signals, a control signal transmission bus connected to the signal transmitting unit and the signal receiving unit, the control signal transmission bus transmitting control signals from the signal transmitting unit to the signal receiving unit, a sampling clock signal transmission line connected to the signal transmitting unit and the signal receiving unit, the sampling clock signal transmission line transmitting sampling clock signals from the signal transmitting unit to the signal receiving unit, a reading unit connected to the signal receiving unit and the bidirectional data signal transmission bus, the reading unit reading the control signals latched in the control signal receiving unit and outputting the control signals to the bidirectional data signal transmission bus, and an evaluation unit connected to the reading unit via the bidirectional data signal transmission bus and the signal transmitting unit. The evaluation unit determines concordance of the control signals outputted by the signal transmitting unit and the control signals read out by the reading unit from the signal receiving unit and calibrating the time phase between the control signals and the sampling clock signals until concordance of the control signals outputted by the signal transmitting unit and the control signals read out the reading unit from the signal receiving unit is determined by the evaluation unit.

According to a fifth embodiment of the invention a control signal training method for an integrated circuit latching control signals in relation to sampling clock signals, the control signal training method comprises a training loop of launching an control signal and a sampling clock signal, latching the control signal in relation to the sampling clock signal, retransmitting the latched control signal, and determining concordance of the launched control signal and the latched control signal. If a control signal match is determined, the training loop is finished. If a control signal mismatch is determined, the time phase between the control signal and the sampling clock signal is shifted and the training loop is repeated.

BRIEF DESCRIPTION OF THE DRAWINGS

These above recited features of the present invention will become clear from the following description, taking in conjunction with the accompanying drawings. It is to be noted, however, that the accompanying drawings illustrate only typical embodiments of the present invention and are, therefore, not to be considered limiting of the scope of the invention. The present invention may admit other equally effective embodiments.

FIG. 5 shows a schematic view of a pin layout according to a fifth embodiment of the present invention.

DETAILED DESCRIPTION OF THE PREFERRED EMBODIMENT

Figure 1:
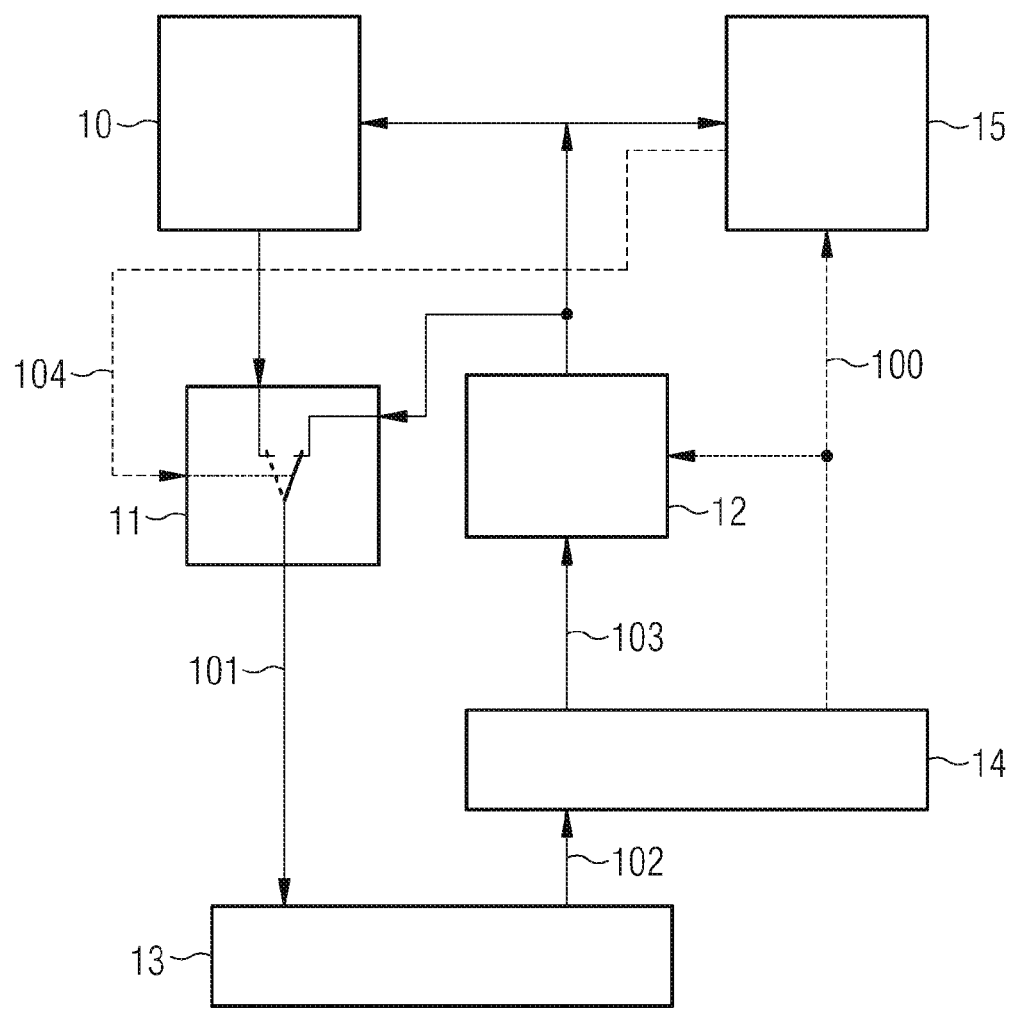
FIG. 1 shows a schematic view of a control signal training system in an integrated circuit according to a first embodiment of the present invention.

FIG. 1 shows a schematic view of a control signal training system in an integrated circuit according to a first embodiment of the present invention. As an example the integrated circuit is a memory including a memory array 10. The memory array 10 stores the information content of the memory. A control unit 15 controls the memory array 10 and may comprise means, such as a register, for controlling a reading unit 11. The reading unit 11 couples either the memory array 10 or a control signal receiving unit 12 to an evaluation unit 13. The evaluation unit 13 may receive a signal having a signal value via a first signal transmission bus 101 from the reading unit 11. Further, the evaluation unit 13 may provide a control signal having a target-value to a signal transmitting unit 14 via a second signal transmission bus 102. The signal transmitting unit 14 transfers the control signal having the target-value via a third signal transmission bus 103 to the control signal receiving unit 12. The signal transmitting unit 14 also provides a sampling clock signal via a sampling clock signal transmission line 100 to the control signal receiving unit 12 and to the control unit 15.

The memory array 10 comprises a plurality of storage units such as memory cells, in which two or more logical states are stored. Examples for such memory cells include DRAM memory cells, Flash-RAM memory cells or resistive memory cells. Said memory cells may be arranged in columns and rows, being coupled to bit lines and word lines. The memory array 10 may further comprise row-decoders and column-decoders to translate an address to the corresponding cells. The control signal receiving unit 12 may store a control signal, which may determine the address within the memory array 10 of a requested memory position. Further, the control signal stored in the control signal receiving unit 12 may be provided to the control unit 15 and may set a register. This register may determine the state of the reading unit 11 via a control line 104. For example, said register may assume a state "0" in which the signal reading unit 11 couples the first signal transmission bus 101 to the memory array 10, whereas the register may assume a state "1", in which the reading unit 11 may couple the first signal transmission bus 101 to the control signal receiving unit 12. In this way, the value of the control signal receiving unit 12 may be read out by the evaluation unit 13 via the first signal transmission bus 101.

The signal transmitting unit 14 may provide the signals on the third signal transmission bus 103 and the sampling clock signal transmission line 100. On third signal transmission bus 103 a control signal is written to the control signal receiving unit 12, the control signal being received from the evaluation unit 13. The clock signal on the sampling clock signal transmission line 100 determines when the control signal receiving unit 12 or when the control unit 15 evaluates the signal state on an input line, such as a line of the third signal transmission bus 103. Since synchronization of the signals on the third signal transmission bus 103 and the sampling clock signal transmission line 100 may be important to avoid data-scrambling or data-loss, the signal transmitting unit 14 provides accurate synchronization and timing of the signals on the third signal transmission bus 103 and the sampling clock signal transmission line 100. The signal transmitting unit 14 may comprise a delay unit for setting a timing and/or a phase difference between the signals on the third signal transmission bus 103 and the sampling clock signal transmission line 100.

According to this embodiment of the present invention, the evaluation unit 13 may instruct the signal transmitting unit 14 via the second signal transmission bus 102, such that it writes a control signal having a target value to the control signal receiving unit 12 via the third signal transmission bus 103. Further, the evaluation unit 13 may instruct the signal transmitting unit 14 such that a control signal having a target value is written to the control unit 15, which, in turn controls the reading unit 11 via the control line 104 such that the reading unit 11 couples the control signal receiving unit 12 to the first signal transmission bus 101. In this way, the evaluation unit 13 may be able to read out control signal which has been written into the control signal receiving unit 12.

In the event that writing of the target value of the control signal by the signal transmitting unit 14 fails, the evaluation unit 13 may detect this by comparing the target value of the control signal, which has been provided to the signal transmitting unit 14, with a read out value of the control signal being received from the first signal transmission bus 101 from the control signal receiving unit 12. The evaluation unit 13 may instruct the signal transmitting unit 14 such that the signal transmitting unit 14 changes the timing or the phase difference between the signals on the third signal transmission bus 103 and the sampling clock signal transmission line 100. The evaluation unit 13 may do so until the read value of the control signal from the control signal receiving unit 12 corresponds to the target value of the control signal which has been instructed to be written into the signal receiving unit 12.

The evaluation unit 13 may employ advantageous algorithms for changing the timing between the two signals on the third signal transmission bus 103 and the sampling clock signal transmission line 100. Such algorithms may include a sweep algorithm which determines timing limits for which target value writing is successful and may set the timing in the centre of the determined limits. Further, such algorithms may include a so called CDR algorithm (clock data recovery). The training and the determination of an adequate timing may be carried out for each line of a transmission bus, such as the third signal transmission bus 103, individually, for a group of lines, or for all lines of a transmission bus together. Hence, it may be required, that two or more lines of a transmission bus provide identical signal fly (propagation) times.

The setting of the timing may be carried out during a training stage, for example, upon initialization of the memory or, repeatedly, within predetermined time intervals. The correct setting of the timing by the evaluation unit 13 may allow an increased data through-put via the third signal transmission bus 103 and the sampling clock signal transmission line 100. It further may compensate for line-length differences of lines of the signal transmission bus 103 and the sampling clock signal transmission line 100, which are, for example, often realized as conductive traces on a printed circuit board. Such traces may already comprise features, such as meandering sections, to ensure a well-defined fly-time of the signals. The memory module according to this embodiment of the present invention may provide further accuracy and also may compensate for unavoidable manufacturing tolerances and, hence, allow a significantly enhanced data throughput. The training stage may be initiated by the memory automatically upon power-up, or may be initiated by respective commands being transmitted from the signal transmission unit 14 to the control signal receiving unit 12.

Figure 2:
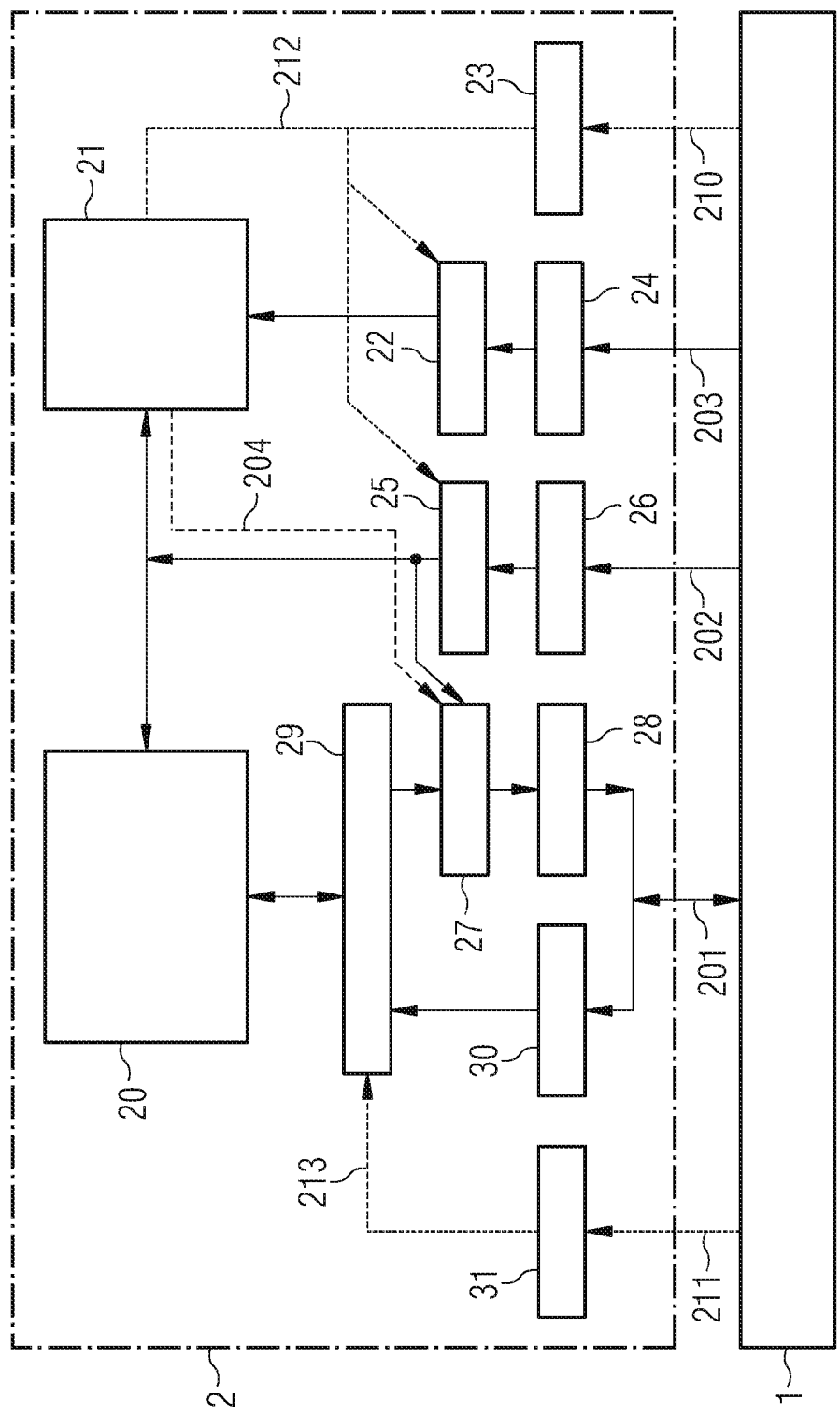
FIG. 2 shows a schematic view of a memory module according to a second embodiment of the present invention.

FIG. 2 shows a schematic view of a memory module according to a second embodiment of the present invention. According to this embodiment, the memory module comprises a memory controller 1 and, at least, one memory device 2. The memory device 2 may comprise a memory array 20, and a control unit 21. The memory array 20 may be a memory array, such as the memory array 10 as described in conjunction with FIG. 1. The control unit 21 may be a control unit, such as the control unit 15 as described in conjunction with FIG. 1.

A first clock receiver 23 may receive a first clock signal 210 and provide a first internal clock signal 212 to the control unit 21 and to a command latch 22 and to an address latch 25. A first input buffer 24 may receive control signals such as command signals from a control signal line 203 and may set accordingly the command latch 22. The command latch 22 may be further coupled to the control unit 21. A second input buffer 26 may receive control signals such as address signals from an address line 202 and may set accordingly the address latch 25. The address latch 25 is coupled to the memory array 20 for setting an access address within the memory array 20. The address latch 25 is also coupled to the control unit 21 to set access addresses of the control unit 21. The address latch 25 is further coupled to a multiplexer 27. The latches 22, 25 are coupled to the first internal clock signal 212 for determination of the time at which the input is evaluated.

Data is written into and/or read from the memory array 20 via a data path 29. For data writing the data path 29 is coupled to a third input buffer 30 and for reading data the data path 29 is coupled to an output buffer 28 via the multiplexer 27. Via a data signal line 201, which is coupled to both the third input buffer 30 and the output buffer 28, the memory device 2 may exchange data. A second clock receiver 31 receives a second clock signal 211 and provides a second internal clock signal 213 to the data path 29.

The memory controller 1 provides the two clock signals 210 and 211, controls the memory device 2 via the control line 203, sets access addresses via the address line 202, and exchanges data via the data line 201. The memory controller 1 may initiate one or more training sequences during an initialization stage and/or during interstitial training stages, the latter being executed within predetermined time intervals. Such a training stage may include one or more training sequences. During a first training sequence, the correct timing of the signals on the address line 202 in respect to the first clock signal on the first sampling clock signal transmission line 210 may be set such that the memory controller 1 may write data signals into the address latch 25 fast and accurately.

According to this embodiment of the present invention, the memory controller 1 may instruct the control unit 21 of the memory device 2, such that it sets the multiplexer 27 via the signal line 204 to a state that the address latch 25 is coupled to the output buffer 28. In this way, the memory controller 1 may write an address signal into the address latch 25 and may verify the actually received address signal via the data line 201. Once the memory controller 1 determines that the address signal which has been written into the address latch 25 does not correspond to the address signal which has been read out from the address latch 25 via the multiplexer 27 and the output buffer 28, the memory controller 1 may change the timing between the address signal on the address line 202 in respect to the sampling clock signal on the first sampling clock signal transmission line 210. It may do so until the received address signal corresponds to the written address signal of the address latch 25. The memory controller 1 may employ algorithms, such as algorithms which have been described in conjunction with FIG. 1, to accurately set correct timing between the signals. The training and the determination of an adequate timing may be carried out for each line individually, for a group of lines of a transmission bus or for all lines of a transmission bus. Hence, it may be required, that two or more lines of a transmission bus provide identical signal fly times.

Further training sequences may be carried out by the memory controller 1 for setting the correct timing between the first clock signal on the first sampling clock signal transmission line 210 and the second clock signal on the second sampling clock signal transmission line 211. A next training sequence may be carried out by the memory controller 1 to set the correct timing between a read signal on the data line 201 and the second clock signal on the second sampling clock signal transmission line 211. A next training sequence may be carried out by the memory controller 1 to set the correct timing between a write signal on the data line 201 and the second clock signal on the second sampling clock signal transmission line 211.

Upon initialization, i.e. prior to any training sequences, the correct setting for the timing is not known to the memory controller 1. Therefore, it should be ensured, that the memory controller 1 may, at least, initially be able to communicate with the memory device 2. Since the correct timing between a clock signal and a control signal on a respective line, such as an address line, command line or data line, is only important for high data throughput speeds, the initial communication may be carried out by a slow communication, such as a single data rate communication (SDR). Once the correct timing for all lines and clock signals have been determined, the memory controller 1 may communicate with the memory device 2 with maximum speed. An alternative to an initial safe communication is the automatic power-on activation of the training mode.

As an initial step, the memory controller 1 may write a respective control signal into the control unit 21, such that the control unit 21 sets the multiplexer 27 to the state that the multiplexer 27 couples the address latch 25 to the output buffer 28. Since this may already require an address to be written into the address latch 25 such as the actual address of the respective mode register in the control unit 21, the memory controller 1 may hold the address signal on the address line 202 constant for a couple of clock cycles, such that it is ensured that the correct address signal value is written into the address latch 25. Once the multiplexer 27 is set to the state that it couples the address latch 25 to the output buffer 28, the memory controller 1 is now able to try a single clock cycle write command or a half clock cycle write command with an initial timing between the signal on the address line 202 in respect to the first clock signal on the first sampling clock signal transmission line 210. The memory controller 1 subsequently verifies the actually received value via the multiplexer 27, the output buffer 28, and the data line 201. The memory controller 1 may now change the timing until the write command results in a reliable and accurate setting of the address latch 25.

The memory controller 1 may now communicate with the memory device 2 with an increased data rate such as a double data rate (DDR). Once fast communication between the memory controller 1 and the address latch 25 is ensured, the memory controller 1 may proceed with the training of other timings, which may rely on a correct fast communication with the address latch 25. Alternatively, the memory controller 1 may also change the timing of the clock signal on the sampling clock signal transmission line 210 in respect to the address line 202.

Figure 3:
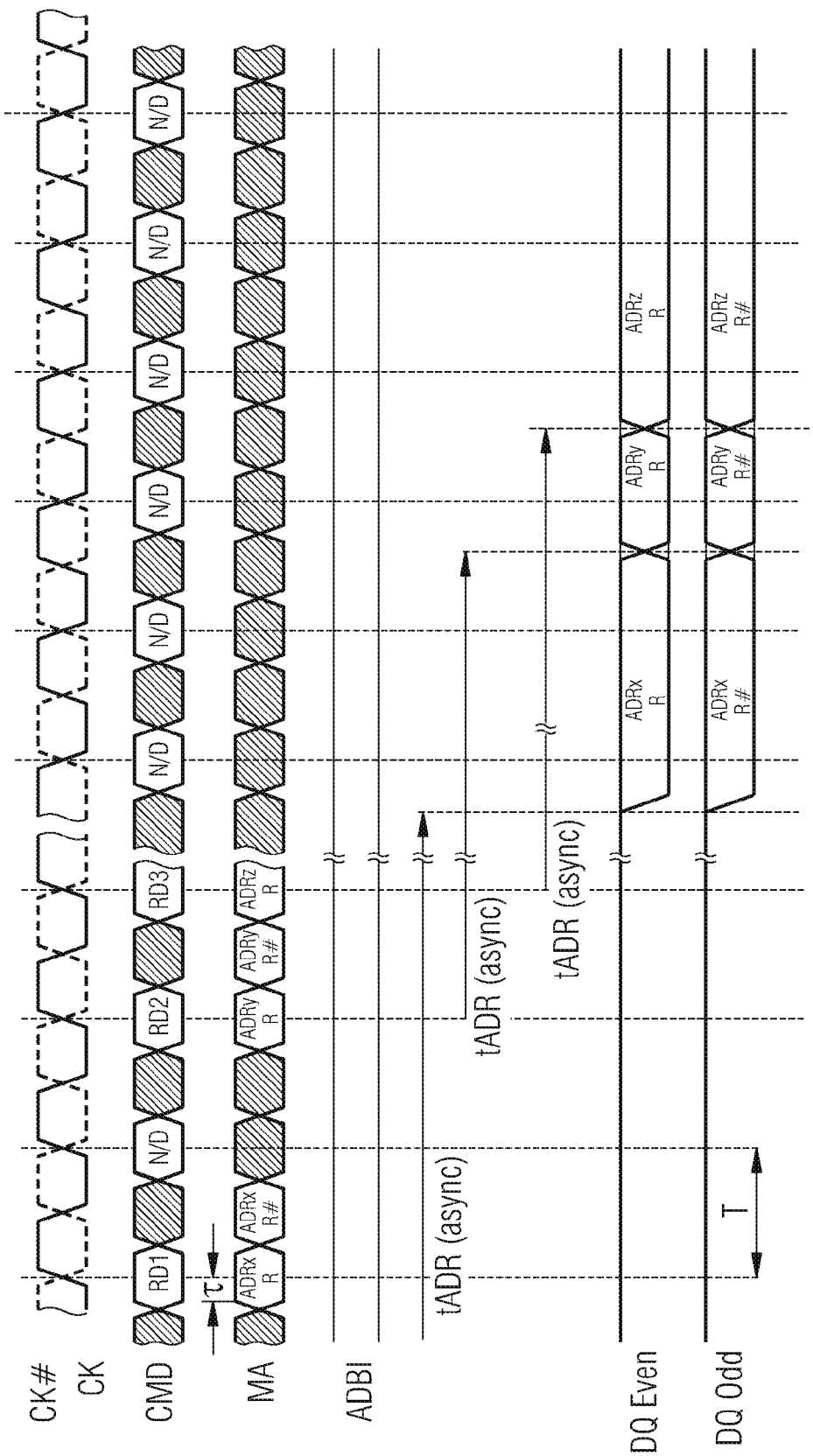
FIG. 3 shows a timing diagram according to a third embodiment of the present invention.

FIG. 3 shows a schematic timing diagram according to a third embodiment of the present invention. A clock signal CK defines a clock period T and alternates between a clock low level and a clock high level. The inverted clock signal is shown as CK#. Command signals CMD may be launched on command lines with a well-defined timing and/or phase difference to the clock signal CK. Commands include a first read command RD1, a second read command RD2, and a third read command RD3. N/D denotes no operation or deselect.

An address transmission bus MA transmits address signals with a certain timing and/or phase difference $\tau$ to the clock signal CK. Assuming that a data word ADRxR shall be available at a latch when there is a CK transition from the clock low level to the clock high level, the delay $\tau$ must ensure the signal availability at that point of time. In a double data rate module (DDR) a data line such as a line of the address transmission bus MA may vary twice within a period T. In this way a rising edge address ADRxR is transmitted on a rising edge of the clock signal CK and a rising edge address ADRxR# is transmitted with the rising edge of the inverted clock signal CK# corresponding to a falling edge of the clock CK. A second and a third word of an address value may be transmitted with the address transmission bus lines assuming the values of a ADRyR, a ADRyR# and a ADRzR etc. An address transmission bus inversion signal ADBI may indicate, that the signals on the address transmission bus MA may be interpreted as inverted signals, in this way a low level representing a high level and a high level representing a low level.

A time tADR after the launch of a read command such as RD1 the read out data ADRxR may be available at a data transmission bus DQ Even or DQ Odd. DQ Even represents data lines of the data transmission bus with even denotation, whereas DQ Odd represents data lines of the data transmission bus DQ with odd denotations. The data at the CK rising edge address ADRxR may be made available at the DQ Even port, whereas the data hat the CK# rising edge address ADRxR# may be made available at the DQ Odd transmission bus.

The example shown in FIG. 3 represents a signal situation during training mode after successfully setting the delay τ. A multiplexer such as the multiplexer 27 as described in conjunction with FIG. 2 may couple the content of an address latch such as the address latch 25 as described in conjunction with FIG. 2 to the data transmission bus DQ. As long as the values at DQ Even and DQ Odd correspond to the values being written during the respective read commands RD1, RD2, and RD3, the time delay τ is accurate. The training mode may be left and an address at MA may result in the read out of a value stored at the respective address in memory array. These values may then be found on DQ Even and DQ Odd.

Figure 4:
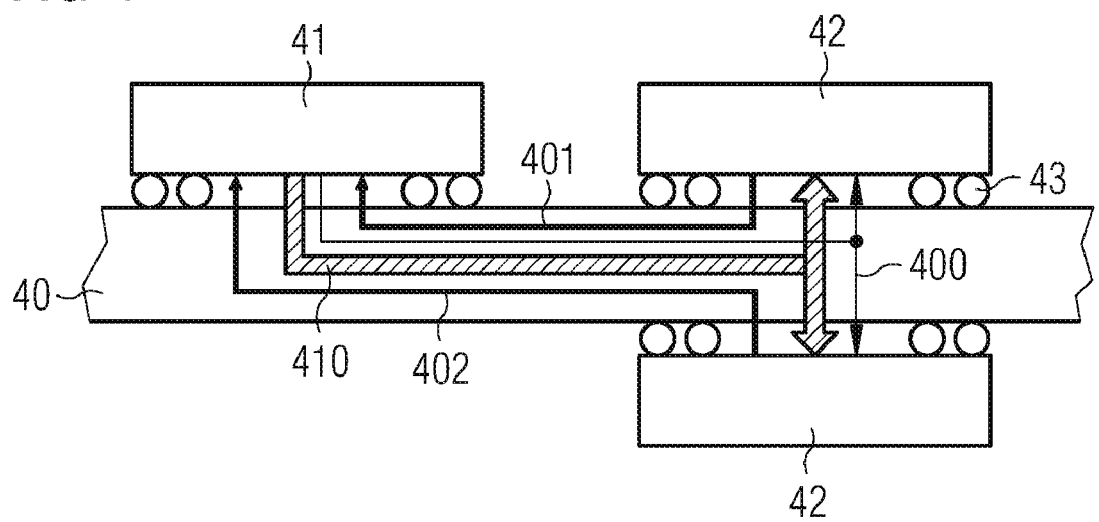
FIG. 4 shows a schematic view of a memory module according to a fourth embodiment of the present invention.

FIG. 4 shows a schematic view of a memory module according to a fourth embodiment of the present invention. The memory module may be a memory module such as a graphic board or a DIMM. The memory module is realized on a printed circuit board (PCB) 40 which comprises a first data line 401, a second data line 402 and an address transmission bus 410. The data lines 401 and 402 and the address transmission bus 410 may be realized as conductive traces in one or more layers in the printed circuit board 40. Traces may end with terminals such as landing pads at connection points 43 for the respective connection to memory devices 42 or a memory controller 41. The memory module may comprise at least one memory controller 41 and at least two memory devices 42. The layout of the two memory devices 42 correspond to the layout of the memory device 2 shown in FIG. 2. The control signals such as the command signals and the address signals of both memory devices are trained independently from each other by the memory controller 41 in the same way as described with respect to the memory device 2 shown in FIG. 2. In a final step the memory controller 41 provide an average value of the time phases which occur between the control signal and the sampling clock signal in each memory device 42.

Modern memory modules take advantage of a symmetrical and appropriate pin layout of the connection points 43 such as shown in FIG. 5. This allows for a simple and reliable connection of more than one memory device 42 to a memory controller 41. According to this embodiment two memory devices 42 are mounted on both sides of the PCB 40. Pin layout of the connection points 43 allow in this arrangement, for example, the same values to be put on the address transmission bus 410, each of the memory devices 42 providing one part of the data via the first data line 401 and the second data line 402. A clock signal 400 may be provided to the memory devices 42 by the memory controller 41. The memory controller 41 may determine the correct timing of a data signal on one of the data lines 401, 402 in respect to the clock signal on a sampling clock signal transmission line 400 during a training sequence. The memory controller 41 further determines a correct timing of the address signal on the address transmission bus 410 in respect to the clock signal on the sampling clock signal transmission line 400 during a training sequence for the two memory devices 42 independently from each other. Then the memory controller 41 forms an average value of the determined time phases for the two memory devices 42.

Figure 6B:
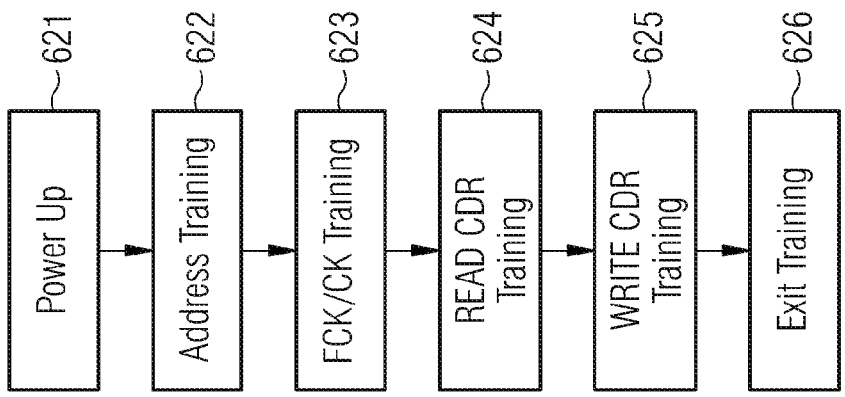
FIGS. 6A and 6B show sequential diagrams of signal training methods according to a sixth and a seventh embodiment of the present invention.
Figure 6A:
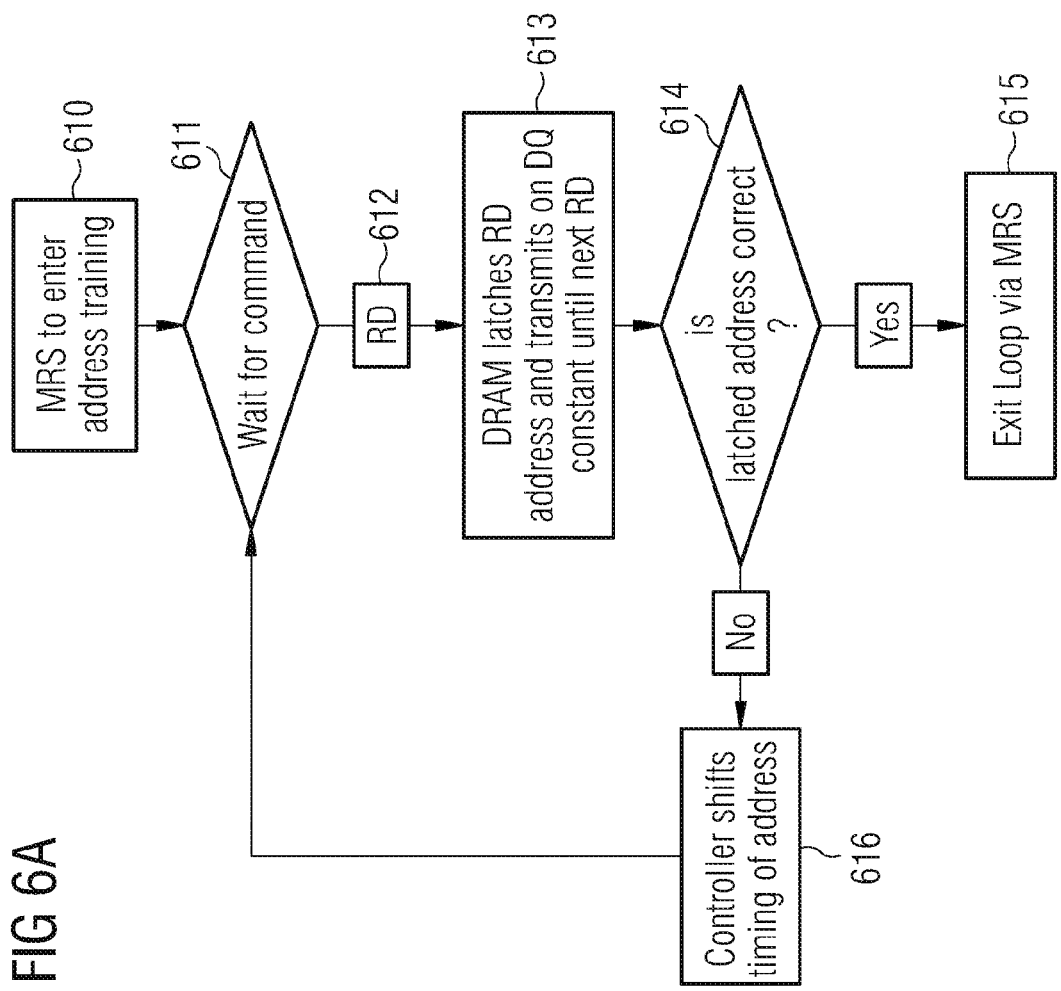

FIG. 6A shows a schematic sequence of a signal training method according to a sixth embodiment of the present invention. An MRS instructs to enter the address training in an initial step 610. In this training mode, the memory device first waits for a command in a waiting loop 611. Once a read command 612 is launched, the DRAM latches in latching step 613 the read address and transmits the value of the latch to the data transmission bus DQ until a next read command is received. The memory controller determines whether the target address, being set during the read command 612, matches the value on the data transmission bus DQ in an evaluation step 614. If the latched address does not correspond to the read result, the controller shifts the timing of the address in respect to the clock signal in a step 616, and the DRAM again waits for a next read command in the waiting loop 611. In case, the latched address matches the read address on the data transmission bus, the training loop is left via an MRS in an exit step 615.

FIG. 6B shows a schematic sequential diagram of a signal training method according to a seventh embodiment of the present invention. After a power up sequence 621, first an address training sequence 622 is initiated. The address training sequence 622 may be such as the address training sequence as described in conjunction with FIG. 6A. After training the address transmission bus to full speed and data rate in step 622, the training of the first clock CK and the second clock FCK is initiated in a clock training sequence 623. Subsequently reading data from the memory array is trained in a read training sequence 623, for example by employing a clock data recovery algorithm (CDR). After reading from the memory array is trained, writing into the memory array may be trained in a write training sequence 625. Upon completion of the write training sequence 625, the training mode may be left in step 626 and the memory device returns to a standard operation mode. The controller has trained the address transmission bus, the read data transmission bus, the write data transmission bus, and the second clock signal FCK to the first clock signal CK which enables the running of all data exchange and communication at maximum speed.

The preceding description describes advantageous exemplary embodiments of the invention. The features disclosed therein and the claims and the drawings can, therefore, be useful for realizing the invention in its various embodiments, both individually and in any combination. While the forgoing is directed to embodiments of the present invention, other and further embodiments of this invention may be devised without departing from the basic scope of the invention, the scope of the present invention being determined by the claims that follow.

What is claimed is:

1. A control signal training system in an integrated circuit, comprising:

a signal transmitting unit for outputting control signals and sampling clock signals, the control signals and the sampling clock signals having a predetermined time phase with respect to each other;

a signal receiving unit for latching control signals in relation to the sampling clock signals;

a control signal transmission bus connected to the signal transmitting unit and the signal receiving unit, the control signal transmission bus being configured for transmitting control signals from the signal transmitting unit to the signal receiving unit;

a sampling clock signal transmission line connected to the signal transmitting unit and the signal receiving unit, the sampling clock signal transmission line being configured for transmitting sampling clock signals from the signal transmitting unit to the signal receiving unit;

a reading unit connected to the signal receiving unit, the reading unit being configured for reading the control signals latched in the control signal receiving unit, and an evaluation unit connected to the reading unit and the signal transmitting unit, the evaluation unit being configured for determining concordance of the control signals outputted by the signal transmitting unit and the control signals read out by the reading unit from the signal receiving unit, the evaluation unit being further configured for adapting the time phase between the control signals and the sampling clock signals step-by-step until concordance of the control signals outputted by the signal transmitting unit and the control signals read out the reading unit from the signal receiving unit is determined by the evaluation unit.

2. The control signal training system of claim 1, wherein the control signal transmission bus is a unidirectional transmission bus.

3. The control signal training system of claim 1, wherein the integrated circuit comprises a plurality of storage units, the storage units capable of communicating data signals to one another via a bidirectional data signal transmission bus, the reading unit being connected to the evaluation unit via the bidirectional data signal transmission bus to transmit the control signals read out by the reading unit from the signal receiving unit.

4. The control signal training system of claim 1, wherein the control signals are address signals.

5. The control signal training system of claim 1, wherein the control signals are command signals.

6. The control signal training system of claim 1, further comprising a control unit configured for setting a training mode.

7. A memory module, comprising:
a memory array including a plurality of memory cells;
a memory controller configured for transmitting control signals, data signals and sampling clock signals;
a control signal latch configured for latching control signals in relation to the sampling clock signals;
a bidirectional data signal transmission bus connected to the memory array and the memory controller, the bidirectional data signal transmission bus configured for transmitting data signals between the memory array and the memory controller;
an control signal transmission bus connected to the memory controller and the control signal latch, the control signal transmission bus configured for transmitting control signals from the memory controller to the control signal latch;
a sampling clock signal transmission line connected to the memory controller and the control signal latch, the sampling clock signal transmission line configured for transmitting sampling clock signals from the memory controller to the control signal latch;
a control unit configured for setting a training mode, and
a multiplexer connected to the control signal latch, the control unit and to the bidirectional data signal transmission bus, the multiplexer being configured to read out the control signals latched in the control signal latch to the memory controller in the training mode;

wherein in the training mode the memory controller is configured for determining concordance of the control signals outputted by the memory controller and the control signals read out by the multiplexer from the control signal latch, the memory controller further configured for adapting the time phase between the control signals and the sampling clock signals step-by-step until concordance of the control signals outputted by the memory controller and the control signals read out the multiplexer from the control signal latch is determined by the memory controller.

8. The memory module of claim 7, wherein the control signal transmission bus is a unidirectional transmission bus.

9. The memory module of claim 7, wherein the control signal transmission bus includes an address signal transmission bus, the control signal latch includes an address signal latch and the control signals include address signals to individually address memory cells of the memory array, the time phase between the control signals and the sampling clock signals being adapted by the memory controller in the training mode.

10. The memory module of claim 9, wherein the address signals are transmitted from the memory controller to the control signal latch via the address signal transmission bus in a double date rate mode with respect to the sampling clock signals.

11. The memory module of claim 10, wherein the control unit includes a single data rate register.

12. The memory module of claim 7, further comprising:
a further a memory array including a plurality of memory cells, a further control signal latch configured for latching control signals in relation to the sampling clock signals, a further control unit configured for setting a training mode, and a further multiplexer, connected to the control signal latch, the control unit and to the bidirectional data signal transmission bus;

wherein the bidirectional data signal transmission bus is connected to the further memory array, the bidirectional data signal transmission bus configured for transmitting data signals between the further memory array and the memory controller;

wherein the control signal transmission bus is connected to the further control signal latch, the control signal transmission bus configured for transmitting control signals from the memory controller to the further control signal latch;

wherein the sampling clock signal transmission line is connected to the memory controller and the further control signal latch, the sampling clock signal transmission line configured for transmitting sampling clock signals from the memory controller to further the further control signal latch;

wherein the further multiplexer read out the control signals latched in the further control signal latch to the memory controller in the training mode;

wherein in the training mode the memory controller is configured for determining concordance of the control signals outputted by the memory controller and the control signals read out by the further multiplexer from the further control signal latch, the memory controller being configured for adapting the time phase between the control signals and the sampling clock signals step-by-step until concordance of the control signals outputted by the memory controller and the control signals read out the further multiplexer from the further control signal latch is determined by the memory controller.

13. The memory module of claim 12, wherein memory controller provides an average value of the time phases which occur between the control signal and the sampling clock signal in each memory device.

14. The memory module of claim 7, wherein the memory module is a DIMM on a printed circuit board.

15. The memory module of claim 7, wherein the memory module is a graphic board on a printed circuit board.

16. A computer system, comprising:
   a signal transmitting unit configured for outputting control signals and sampling clock signals, the control signals and the sampling clock signals;
   a signal receiving unit configured for latching control signals in relation to the sampling clock signals;
   a control signal transmission bus connected to the signal transmitting unit and the signal receiving unit, the control signal transmission bus configured for transmitting control signals from the signal transmitting unit to the signal receiving unit;
   a sampling clock signal transmission line connected to the signal transmitting unit and the signal receiving unit, the sampling clock signal transmission line configured for transmitting sampling clock signals from the signal transmitting unit to the signal receiving unit;
   a reading unit connected to the signal receiving unit, the reading unit configured for reading the control signals latched in the control signal receiving unit; and
   an evaluation unit connected to the reading unit and the signal transmitting unit, the evaluation unit configured for determining concordance of the control signals outputted by the signal transmitting unit and the control signals read out by the reading unit from the signal receiving unit, the evaluation unit further configured for calibrating the time phase between the control signals and the sampling clock signals until concordance of the control signals outputted by the signal transmitting unit and the control signals read out the reading unit from the signal receiving unit is determined by the evaluation unit.

17. The computer system of claim 16, wherein the control signal transmission bus is a unidirectional transmission bus.

18. The computer system of claim 16, wherein the control signals are address signals.

19. The computer system of claim 16, wherein the control signals are command signals.

20. A computer system, comprising:
   a plurality of storage units configured for transmitting data signals via a bidirectional data signal transmission bus to the plurality of storage units;
   a signal transmitting unit configured for outputting control signals and sampling clock signals, the control signals and the sampling clock signals;
   a signal receiving unit configured for latching control signals in relation to the sampling clock signals;
   a control signal transmission bus connected to the signal transmitting unit and the signal receiving unit, the control signal transmission bus configured for transmitting control signals from the signal transmitting unit to the signal receiving unit;
   a sampling clock signal transmission line connected to the signal transmitting unit and the signal receiving unit, the sampling clock signal transmission line configured for transmitting sampling clock signals from the signal transmitting unit to the signal receiving unit;
   a reading unit connected to the signal receiving unit and the bidirectional data signal transmission bus, the reading unit configured for reading the control signals latched in the control signal receiving unit and further configured for outputting the control signals to the bidirectional data signal transmission bus; and
   an evaluation unit connected to the reading unit via the bidirectional data signal transmission bus and the signal transmitting unit, the evaluation unit configured for determining concordance of the control signals outputted by the signal transmitting unit and the control signals read out by the reading unit from the signal receiving unit, the evaluation unit further configured for calibrating the time phase between the control signals and the sampling clock signals until concordance of the control signals outputted by the signal transmitting unit and the control signals read out the reading unit from the signal receiving unit is determined by the evaluation unit.

21. The computer system of claim 20, wherein the control signal transmission bus is a unidirectional transmission bus.

22. The computer system of claim 20, wherein the control signals are command signals.

23. The computer system of claim 20, wherein the control signals are address signals.

24. The computer system of claim 23, wherein the control signal transmission bus includes an address signal transmission bus, the signal receiving unit includes an address signal latch and the control signals include address signals to individually address storage units, the time phase between the address signals and the sampling clock signals being adapted in a training mode.

25. The computer system of claim 23, wherein the address signals are transmitted in a double date rate mode with respect to the sampling clock signals.

26. A control signal training method for an integrated circuit latching control signals in relation to sampling clock signals, the control signal training method comprising a training loop of:
   launching an control signal and a sampling clock signal;
   latching the control signal in relation to the sampling clock signal;
   retransmitting the latched control signal; and
   determining concordance of the launched control signal and the latched control signal;
   wherein, if an control signal match is determined, the training loop is terminated; and
   wherein, if an control signal mismatch is determined, the time phase between the control signal and the sampling clock signal is shifted and the training loop is repeated.

27. The control signal training method of claim 26, wherein the control signal is maintained during the training loop.

* * * * *